United States Patent
Kim et al.

(10) Patent No.: US 6,653,225 B2
(45) Date of Patent: Nov. 25, 2003

(54) METHOD FOR FORMING GATE ELECTRODE STRUCTURE WITH IMPROVED PROFILE AND GATE ELECTRODE STRUCTURE THEREFOR

(75) Inventors: Bong-Soo Kim, Kyungki-do (KR); Byong-Sun Ju, Seoul (KR); Jae-Cheol Paik, Kyungki-do (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/970,536

(22) Filed: Oct. 3, 2001

(65) Prior Publication Data

US 2002/0056917 A1 May 16, 2002

(30) Foreign Application Priority Data

Nov. 10, 2000 (KR) .......................... 2000-66830

(51) Int. Cl.⁷ .......................................... H01L 21/4763
(52) U.S. Cl. ................... 438/630; 438/582; 438/586; 438/648; 438/592
(58) Field of Search ................ 438/648, 586, 438/582, 630, 649, 592, 585; 257/411, 412, 413

(56) References Cited

U.S. PATENT DOCUMENTS

| 5,434,096 A | * | 7/1995 | Chu et al. ................ 437/44 |
| 5,576,228 A | * | 11/1996 | Chen et al. .............. 437/35 |
| 5,605,854 A | * | 2/1997 | Yoo ........................ 437/44 |
| 6,040,238 A | * | 3/2000 | Yang et al. .............. 438/592 |
| 6,087,254 A | * | 7/2000 | Pan et al. ............... 438/659 |
| 6,465,362 B1 | * | 10/2002 | Chae ....................... 438/714 |

OTHER PUBLICATIONS

Stanley Wolf and Richard N. Tauber, "Silicon Processing for the VLSI Era: vol. 1," Lattice Press, Sunset Beach, CA., (1986) pp. 394–395.*

Vivek Jain and Dipankar, "In–Situ Stress Changes of WSi (x) Film During Polycide Process Sequence," Proc. 7$^{th}$ International VLSI Multilevel Interconnection Conference (1990), pp.261–267.*

Vivek Jain and Dipankar Pramanik, "In–Situ Changes of WSi(x) Film During Polycide Process Sequence," Proc. 7$^{th}$ International VLSI Multilevel Interconnection Conference (1990), pp. 261–267.*

S.R. Wilson, C.J. Tracey and J.L. Freeman, Jr., "Handbook of Multilevel Metallization for Integrated Circuits", Noyes Publ.,New Jersey (1993).*

* cited by examiner

Primary Examiner—Tom Thomas
Assistant Examiner—Thomas Magee
(74) Attorney, Agent, or Firm—Marger Johnson & McCollom, P.C.

(57) ABSTRACT

A gate electrode, in which the slope of the profile of a gate electrode forming material layer, for example, a refractory metal silicide layer is prevented from being decreased due to thermal expansion by patterning a refractory metal silicide layer after performing a thermal process on a refractory metal silicide layer, thereby having a stable operation characteristic, and a method for manufacturing the same are provided.

9 Claims, 5 Drawing Sheets

METHOD FOR FORMING GATE ELECTRODE STRUCTURE WITH IMPROVED PROFILE AND GATE ELECTRODE STRUCTURE THEREFOR

RELATED APPLICATION

This application relies for priority upon Korean Patent Application No. 2000-66830, filed on Nov. 10, 2000, the contents of which are herein incorporated by reference in their entirety.

BACKGROUND OF THE INVENTION

1. Field of the Invention

The present invention relates to a semiconductor device and a method therefor, and more particularly, to a gate electrode structure with an improved profile, and a method for manufacturing the same.

2. Description of the Related Art

As the degree of integration in semiconductor memory devices increases, areas occupied by separate devices, for example, a transistor, are reduced. In the transistor, hot carriers are generated in a channel region due to a short channel effect according to the reduction in area. In order to solve problems associated with the hot carrier effects, a lightly doped drain and source (LDD) transistor, in which source and drain regions are formed after forming spacers on the sidewalls of the gate electrode of the transistor and the sidewalls of a capping layer, are provided. Here, the capping layer is an insulating film formed on the gate electrode to protect the gate electrode in subsequent processing steps.

In general, a polycide, a structure with a refractory metal silicide layer formed on top of the polysilicon gate, is used to form a gate electrode. Typically, a thermal process is used to decrease the resistance of the gate electrode after forming the capping layer and the gate electrode. However, the refractory metal silicide layer becomes much larger than the capping layer during thermal expansion due to a variation in the coefficients of thermal expansion between the two materials. Accordingly, the profile of the gate electrode structure is not vertical but sloped.

Recently, a self-aligned contact hole is formed between the gate electrodes and then filled with a conductive material. As the semiconductor device is highly integrated, the slope of the sidewall of the gate electrode decreases and a sidewall spacer becomes thinner. Accordingly, the possibility of shorts between a conductive layer formed in the self-aligned contact hole and the gate electrodes substantially increases.

In order to prevent such shorts between the gate electrodes and the conductive layer, there have been attempts to increase the thickness of the spacer. However, as the thickness of the spacer increases, the distance between the gate electrodes becomes smaller. Therefore, voids are generated when the space between the gate electrode structures is filled with an interlayer insulating layer. Subsequently, voids are filled with the conductive material and undesirably connected to the conductive layer formed in an adjacent self-aligned contact hole, resulting in device failure.

SUMMARY OF THE INVENTION

It is, therefore, an object of the present invention to provide a gate electrode structure, in which the slope of the profile of the gate electrode structure increases.

Accordingly, to achieve the above object, after sequentially forming a gate electrode conductive layer, for example, a polycide formed of polysilicon and a refractory metal silicide layer, and an insulating layer to form a capping layer on a semiconductor substrate, a thermal process is performed on the semiconductor substrate. The capping layer and the gate electrode are then formed by patterning an insulating layer and a conductive layer.

In another embodiment, after forming the conductive layer for the gate electrode and the insulating layer for the capping layer, the capping layer is formed by patterning the insulating layer. The thermal process is performed on the semiconductor substrate including the conductive layer. Then, the gate electrode and the spacer are formed.

According to the above-mentioned method, it is possible to skip a thermal process between a process of patterning the gate electrode and a process of forming the spacer by performing a thermal process on the conductive layer before the patterning process for forming the gate electrode. Also, it is possible to prevent the slope of the profile of the gate electrode structure from being decreased by patterning the conductive layer for the gate electrode, which is already thermally expanded. Here, that the slope of the profile of the gate electrode structure becomes decreased may mean that the slope of the side surface of the gate electrode structure is less than 80° in a peripheral region and is less than 83° in a core region.

BRIEF DESCRIPTION OF THE DRAWING(S)

The above object and advantages of the present invention will become more apparent by describing in detail a preferred embodiment thereof with reference to the attached drawings in which.

DESCRIPTION OF THE PREFERRED EMBODIMENTS

Figure 1:
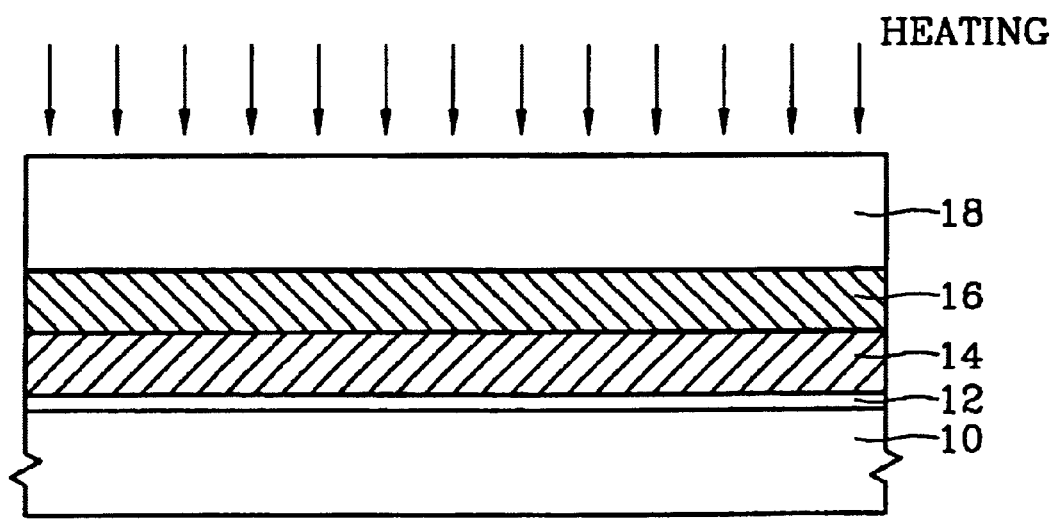
FIGS. 1 through 3 illustrate a method of forming a gate electrode structure having an improved profile according to an embodiment of the present invention.

In FIG. 1, an oxide film 12 for forming a gate insulating film, a polysilicon layer 14, a tungsten silicide layer 16 that is one of refractory metal silicide layers, and a silicon nitride film 18 for forming a capping layer are formed on a semiconductor substrate 10. It will be appreciated by a person skilled in the art that other silicide layers such as a cobalt silicide layer or a titanium silicide layer can be used instead of the tungsten silicide layer 16. Metal oxide films such as a silicon oxide film, a silicon oxinitride film, an aluminum oxide film, or a tantalum oxide film can be used instead of the silicon nitride film 18 depending on process conditions.

After forming a silicon nitride film 18, a thermal process can be performed on the semiconductor substrate 10. The tungsten silicide layer 16 is expanded by the thermal process. A rapid thermal processing (RTP) or a furnace can be used for the thermal process.

Figure 2:
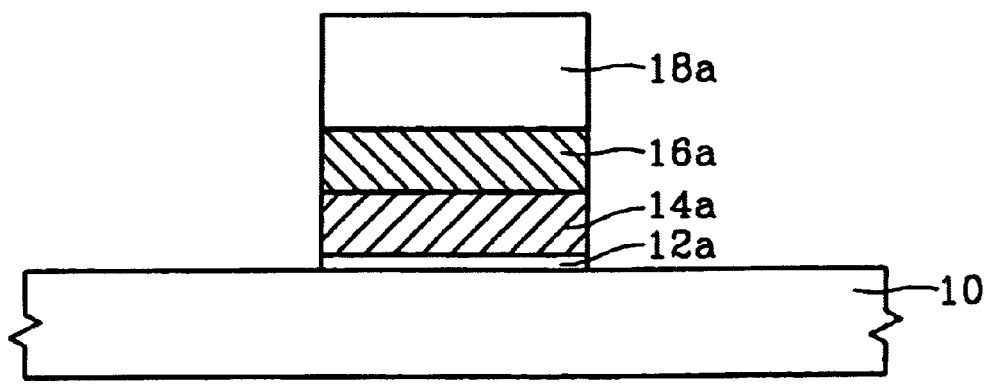

In FIG. 2, a capping layer 18a, gate electrodes 16a and 14a, and a gate oxide film 12a are formed by sequentially patterning a silicon nitride film 18, a tungsten silicide layer 16, a polysilicon layer 14, and a silicon oxide film 12. During the above patterning process, the same mask can be used with respect to all the layers formed on the semiconductor substrate 10.

Figure 3:
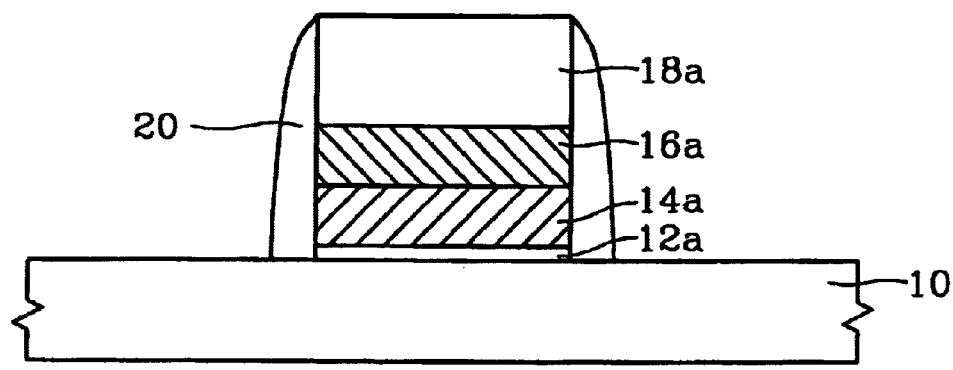

In FIG. 3, spacers 20 are formed on the sidewalls of the gate electrodes 14a and 16a and the capping layer 18a. A stacked structure of a gate oxide film, a gate electrode, and a capping layer and spacers are referred herein to as a gate electrode structure. Although not shown, any damage to the sidewall surfaces of the gate electrodes 14a and 16a and the capping layer 18a can be cured by growing an oxide film in an oxygen atmosphere before forming the spacers 20.

Figure 4:
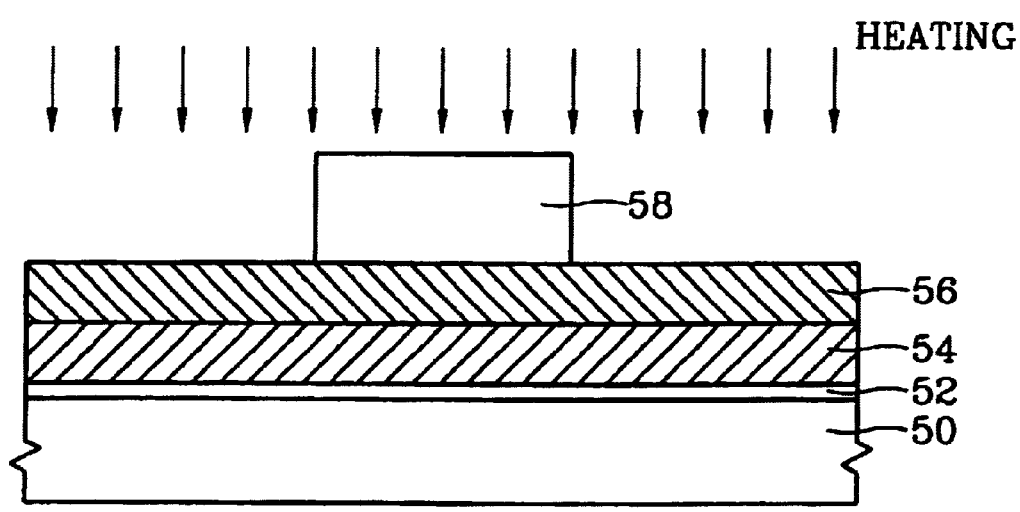
FIG. 4 illustrates a method of forming a gate electrode structure having an improved profile according to another embodiment of the present invention.

FIG. 4 shows another method of forming a gate electrode structure according to one embodiment of the present invention. After sequentially forming a silicon oxide film 52, a polysilicon layer 54, a refractory metal silicide layer 56, and a silicon nitride film (not shown) on a semiconductor substrate 50, a capping layer 58 is formed by patterning the silicon nitride film. The thermal process is performed after forming the capping layer 58. A gate electrode (not shown) and a gate oxide film (not shown) are formed by sequentially patterning the refractory metal silicide layer 56, the polysilicon layer 54, and the silicon oxide film 52 using the capping layer 58 as a mask. As shown in FIG. 3, spacers (not shown) may be formed on the sidewalls of the gate electrode and the capping layer 58.

The (sloped) profile of the sidewalls of the gate electrode manufactured according to the present invention and the profile of the gate electrode formed according to the conventional technologies are shown in FIGS. 5A, 5B, 6A, 6B, 7A, and 7B. The gate electrodes and the capping layers shown in FIGS. 5A, 5B, 6A, 6B, 7A, 7B, and 8 denote a gate electrode formed of a polysilicon layer of 800 Å and a tungsten silicide layer of 1000 Å, and a capping layer formed of a silicon nitride film of 1800 Å. They are thermally treated for approximately 15 seconds at approximately 1050° C.

Figure 5A:
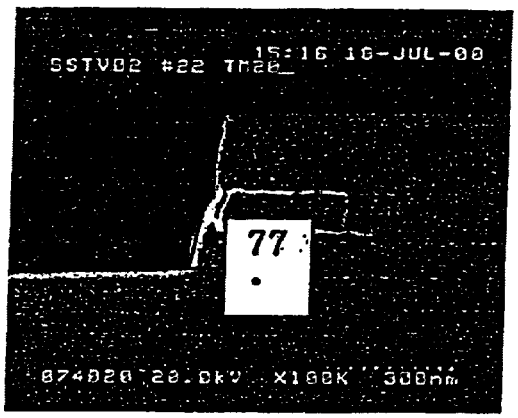
FIGS. 5A and 5B show profiles of a gate electrode structure manufactured according to a conventional technology.
Figure 5B:
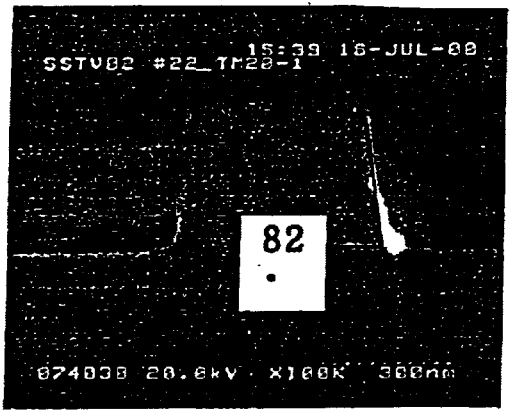
Figure 6A:
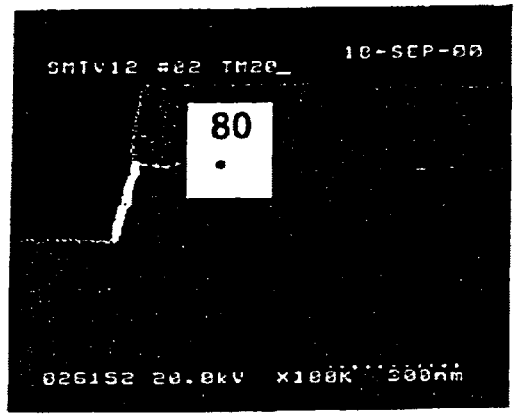
FIGS. 6A and 6B show the profile of a gate electrode structure manufactured according to an embodiment of the present invention.
Figure 6B:
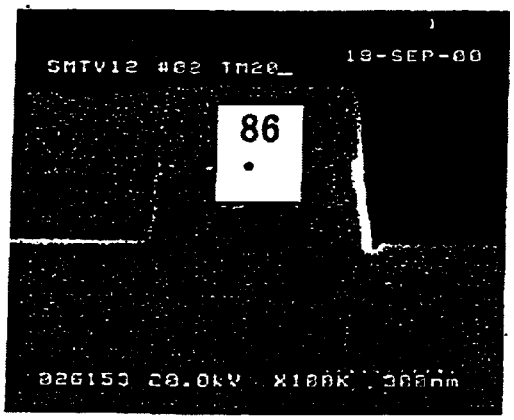
Figure 7A:
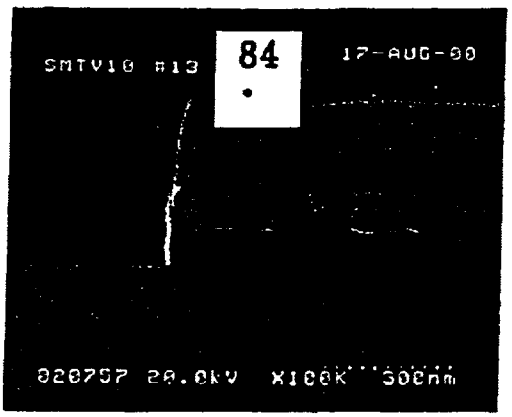
FIGS. 7A and 7B show the profile of a gate electrode structure manufactured according to another embodiment of the present invention.
Figure 7B:
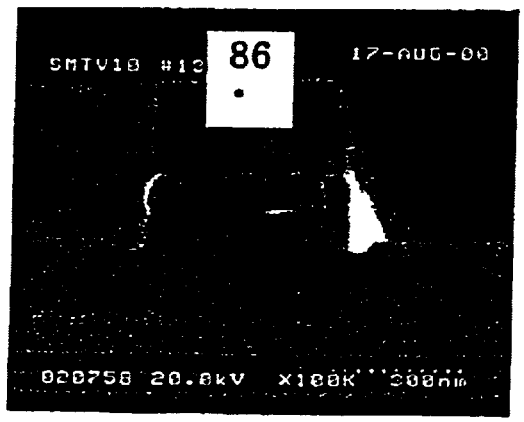

FIGS. 5A, 6A, and 7A show the gate electrode and the capping layer formed in the peripheral region of the semiconductor integrated circuit. FIGS. 5B, 6B, and 7B show the gate electrode and the capping layer formed on the core region of the semiconductor integrated circuit.

In the peripheral region, an angle formed between the sidewall of the gate electrode and the semiconductor substrate is about 77° in the conventional technology. However, an angle formed between the sidewall of the gate electrode and the semiconductor substrate increases to 80° (in the first embodiment) and 84° (in the second embodiment) according to the present invention. In the core region, an angle formed between the sidewall of the gate electrode and the semiconductor substrate is about 82° in the conventional technology. However, an angle formed between the sidewall of the gate electrode and the semiconductor substrate is about 86° in accordance with the first and second embodiments of the present invention.

Figure 8:
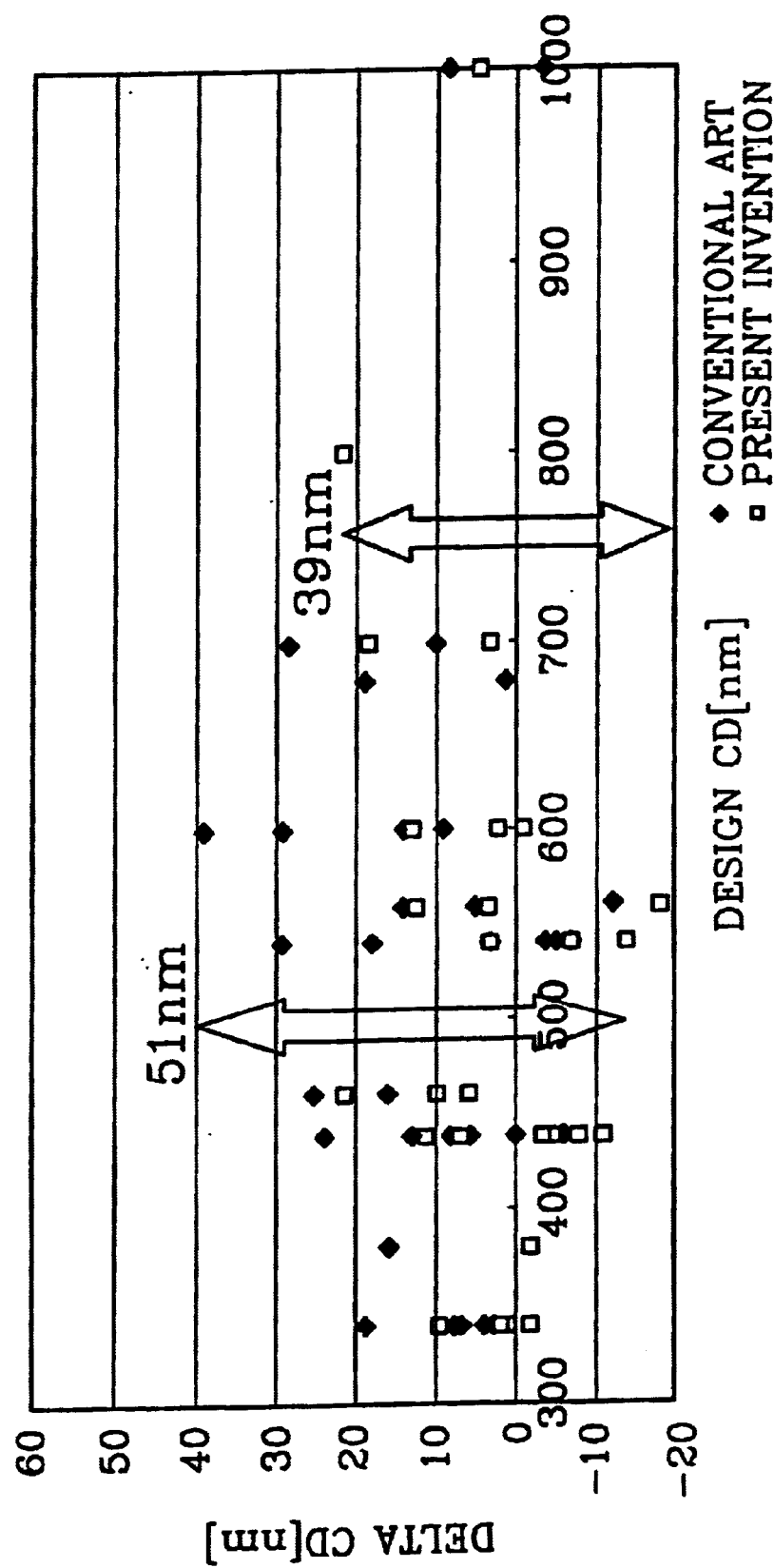
FIG. 8 shows the ranges of fluctuation of the critical dimensions (CD) of gate electrode structures formed according to a conventional technology and according to the present invention.

When the gate electrode is formed according to the present invention, as shown in FIG. 8, the range of fluctuation of the critical dimension (CD) of the gate electrode is 39 nm, which is less than 59 nm, which is the range of fluctuation of the CD of the gate electrode according to the conventional technologies. Therefore, it is possible to form the gate electrode having more stable operation characteristics with the present invention. In FIG. 8, the horizontal axis denotes a design CD of the gate electrode and the vertical axis denotes a delta CD, which shows the range of fluctuation.

Thus, it is possible to prevent the slope of the profile of the gate electrode from being decreased by patterning the already-heat-treated tungsten silicide layer 16, i.e., which is thermal expanded, during the formation of the gate electrode. Therefore, the spacer formed on the sidewalls of the gate electrode structure can have a desired thickness. Accordingly, an insulating effect by the spacer is not reduced. Also, the range of fluctuation of the threshold value of the gate electrode is reduced. Accordingly, it is possible to form a gate electrode having stable operation characteristics.

Having illustrated and described the principles of our invention in a preferred embodiment thereof, it should be readily apparent to those skilled in the art that the invention can be modified in arrangement and detail without departing from such principles. We claim all modifications coming within the spirit and scope of the accompanying claims.

What is claimed is:

1. A method for manufacturing a gate electrode structure, comprising:

providing a semiconductor substrate;

forming a gate insulating layer on the semiconductor substrate;

sequentially forming a conductive layer and a capping insulating layer on the semiconductor substrate including the gate insulating layer;

forming a patterned capping insulating layer by patterning the capping insulating layer;

thereafter, performing a thermal process on the semiconductor substrate including the conductive layer and the patterned capping insulating layer; and forming a gate electrode by patterning the conductive layer using the patterned capping insulating layer as a mask, wherein the thermal process prevents the slope of the profile of the gate electrode from being decreased and the gate electrode and the patterned capping insulating layer forms a gate electrode structure to be used in a self-aligned contact (SAC) process.

2. The method of claim 1, further comprising forming spacers on the sidewalls of the patterned capping layer and the gate electrode.

3. The method of claim 1, wherein the conductive layer comprises a polysilicon layer and a refractory metal silicide layer, which are sequentially stacked.

4. The method of claim 1, wherein the thermal process is performed using a rapid thermal process or a furnace.

5. The method of claim 1, wherein the capping insulating layer comprises silicon nitride or metal oxide.

6. The method of claim 5, wherein the metal oxide is a silicon oxide layer, a silicon oxinitride layer, an aluminum oxide layer, or a tantalum oxide layer.

7. The method of claim 1, wherein the thermal process is performed for approximately 15 seconds at approximately 1050° C.

8. The method of claim 1, wherein the angle formed between the gate electrode and the semiconductor substrate is not less than approximately 80° in a peripheral region and is not less than approximately 83° in a core region.

9. A method for manufacturing a gate stack, the method comprising:

forming a gate dielectric layer on a semiconductor substrate;

sequentially forming a conductive layer and a capping insulating layer on the gate dielectric layer;

patterning the capping insulating layer to form a patterned capping insulating layer and to expose upper surfaces of the conductive layer;

heat treating the conductive layer having the exposed upper surfaces, after forming a patterned capping insulating layer; and patterning the heat-treated-conductive layer, using the patterned capping insulating layer as a mask, to complete a gate stack to be used in a self-aligned contact (SAC) process.

* * * * *